United States Patent [19]

Sugiyama et al.

[11] Patent Number: 5,796,585
[45] Date of Patent: Aug. 18, 1998

[54] ELECTRONIC EQUIPMENT MOUNTING DEVICE

[75] Inventors: Akira Sugiyama, Tokyo; Tsutomu Hoshino, Otsuki, both of Japan

[73] Assignee: Kabushiki Kaisha Toshiba, Kawasaki, Japan

[21] Appl. No.: 555,401

[22] Filed: Nov. 9, 1995

[30] Foreign Application Priority Data

Nov. 11, 1994 [JP] Japan .................... 6-277405

[51] Int. Cl.$^6$ .................... H05K 5/00; H04M 1/00
[52] U.S. Cl. .................... 361/735; 361/832; 361/829; 361/740; 361/732; 361/731; 174/58; 174/61; 174/50.54; 174/52.1; 312/242; 312/245; 312/223.4; 312/223.2; 312/111; 312/107; 108/108; 108/110; 379/435; 379/436; 379/338; 379/454
[58] Field of Search .................... 312/242, 245, 312/223.4, 223.2, 111, 107; 108/108, 110; 379/435, 436, 338, 454, 445; 174/58, 61, 50.54, 52.1; 361/832, 829, 740, 732, 731

[56] References Cited

U.S. PATENT DOCUMENTS 3,822,050  7/1974  Schurr ...................... 248/309.1
5,402,487  3/1995  Swett ........................ 379/435

*Primary Examiner*—Leo P. Picard
*Assistant Examiner*—David Foster
*Attorney, Agent, or Firm*—Finnegan, Henderson, Farabow, Garrett & Dunner, L.L.P.

[57] ABSTRACT

To provide an electronic equipment mounting device having flexibility in the mounting direction, the device is provided with a mounting jig on which a plurality of tongues are formed and a housing whose flat faces having different areas have slits in them, the tongues being inserted into the slits in a detachable manner. The mounting jig is mounted on, for example, the surface of a wall, and then the housing is coupled to the mounting jig by selectively using one of its side faces.

17 Claims, 8 Drawing Sheets

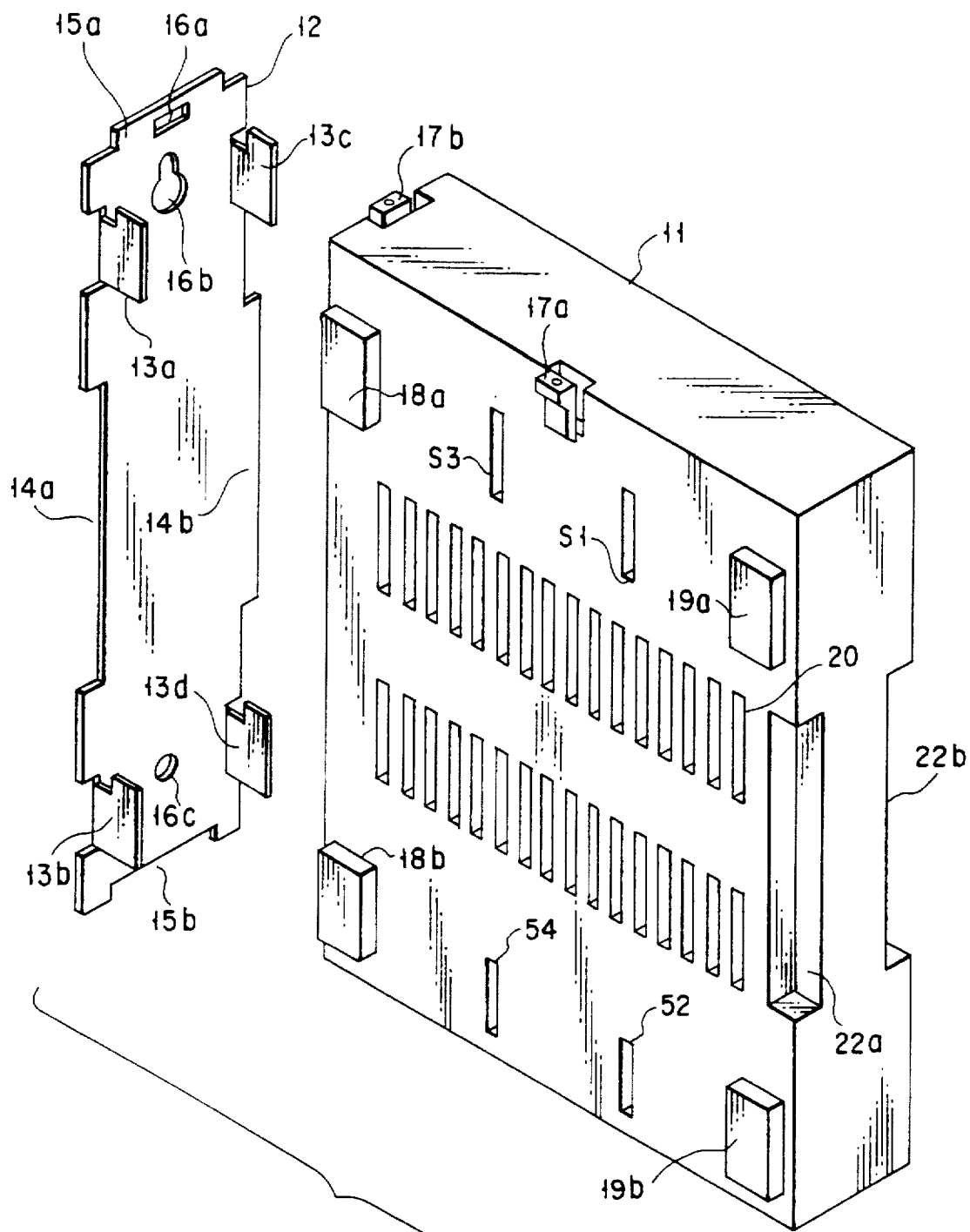
F I G. 2

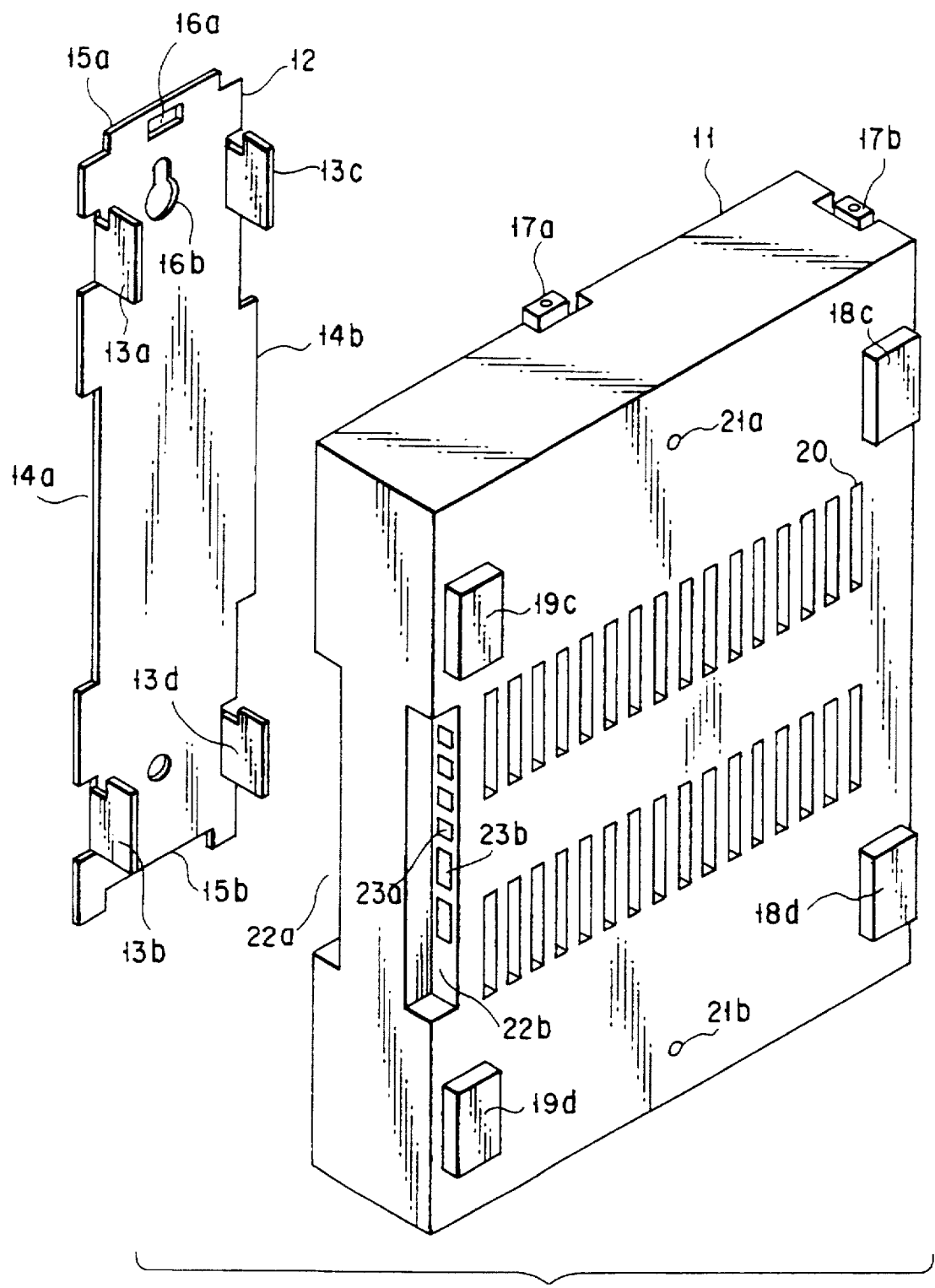
F I G. 3

ELECTRONIC EQUIPMENT MOUNTING DEVICE

BACKGROUND OF THE INVENTION

1. Field of the Invention

This invention relates to an electronic equipment mounting device composed of a housing for such electronic equipment as a key telephone unit or a telephone exchange needed to be expandable and a mounting jig for installing the electronic equipment on, for example, the surface of a wall.

2. Description of the Related Art

A housing for conventional electronic equipment will be described through an example of a key telephone unit with reference to FIG. 1.

FIG. 1 is a front view of a key telephone unit. Numeral 1 indicates a basic housing composed of a main section 1a and a side section 1b. Between the main section 1a and the side section 1b, an expansion housing 2 is sandwiched. In the basic housing 1 and expansion housing 2, circuit units (not shown) are placed.

The expansion housing 2 is added to the basic housing 1 when all of the necessary circuit units cannot be placed in the basic housing 1. The expansion housing is used to accommodate the circuit units that cannot be placed in the basic housing 1.

In a conventional key telephone unit as described above, the basic housing and the expansion housing 2 have been made to specific sizes so that many circuit units may be housed in a single housing. Therefore, when the area of the mounting place is taken into consideration, it is impossible to add many expansion housings 2 to the basic housing 1.

Since the basic housing and expansion housing 2 have been made so as to have specific sizes, the number of expansion housings to be added cannot be made too large. As a result, a division unit of circuit units placed in the basic housing 1 and expansion housing 2 becomes larger. This has made it impossible to deal with the needs of users elaborately in the case of the conventional device. Another problem is that even if the number of circuit units that cannot be housed in the basic housing 1 is very small, they are placed in a relatively large expansion housing 2, with the result that the device as a whole becomes larger than necessary.

With the conventional key telephone unit, the face fixed on the surface of a wall or the like has usually been determined to be the face having the maximum area. Accordingly, to add an extension housing 2, the area of the mounting section of the key telephone unit must be made so much larger.

Furthermore, the conventional key telephone unit is secured to the wall surface by screws which are driven into the wall through the holes made in the mounting face of the basic housing 1. With this approach, however, the mounting of the expansion housing 2 causes the basic housing to lose its balance and become unstable, bringing about the fear that the expansion housing 2 can come off.

SUMMARY OF THE INVENTION

As described above, with the conventional electronic equipment, since a division unit of electronic circuits placed in a single housing is large, it is impossible to fulfill the needs of user elaborately. Furthermore, when an expansion housing is added to the basic housing, this causes the problem that the area of the mounting area becomes large. In addition, because the mounting jigs to the surface of a wall do not match with an expansion housing, this causes the problem that the stability after mounting is poor.

The object of the present invention is to provide an electronic equipment mounting device which solves the aforementioned problems, has flexibility in the mounting direction, facilitates the combination of as many housings as necessary, enables effective use of the space in the mounting place, and assures excellent heat dissipation through the combination of housings.

The foregoing object is accomplished by providing an electronic equipment mounting device comprising: a rectangular parallelepipedic housing that contains electronic circuit units of electronic equipment and has at least a first side face and a second side face adjoining each other and differing in area; and a flat-plate mounting jig that is selectively coupled in a detachable manner to either the first side face or the second side face of the housing and mounts the housing in any place.

The foregoing object is further accomplished by providing an electronic equipment mounting device comprising: a plurality of rectangular parallelepipedic housings, each of which contains divided electronic circuit units of electronic equipment and has at least a first side face and a second side face adjoining each other and differing in area; and flat-plate mounting jigs which are provided so as to correspond to the plurality of housings and each of which is selectively coupled in a detachable manner to either the first side face or the second side face of the corresponding housing and mounts the housing in any place, and further each of which has a height larger than the height in the mounting direction of the first and second side faces of the housing and has the top end and the bottom end formed into a projecting shape and a recessed shape that fit to each other, and which are arranged vertically so that the top end may fit to the bottom end, and secure a clearance between the housings when the housings have been coupled to the individual mounting jigs.

The foregoing object is still further accomplished by providing an electronic equipment mounting device comprising: a plurality of rectangular parallelepipedic housings, each of which contains divided electronic circuit units of electronic equipment and has at least a first side face and a second side face adjoining each other and differing in area; and flat-plate mounting jigs which are provided so as to correspond to the plurality of housings and each of which is selectively coupled in a detachable manner to either the first side face or the second side face of the corresponding housing and mounts the housing in any place, wherein the plurality of mounting jigs each have screw holes in them, and the plurality of housings each have holes in them for screwing the mounting jigs to the faces opposite to those having a larger area of the mounting jig coupling faces and enable additional housings to be piled on them by screwing the mounting jigs to the faces.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed descrip-

3 tion of the preferred embodiments given below, serve to explain the principles of the invention.

Figure 1:
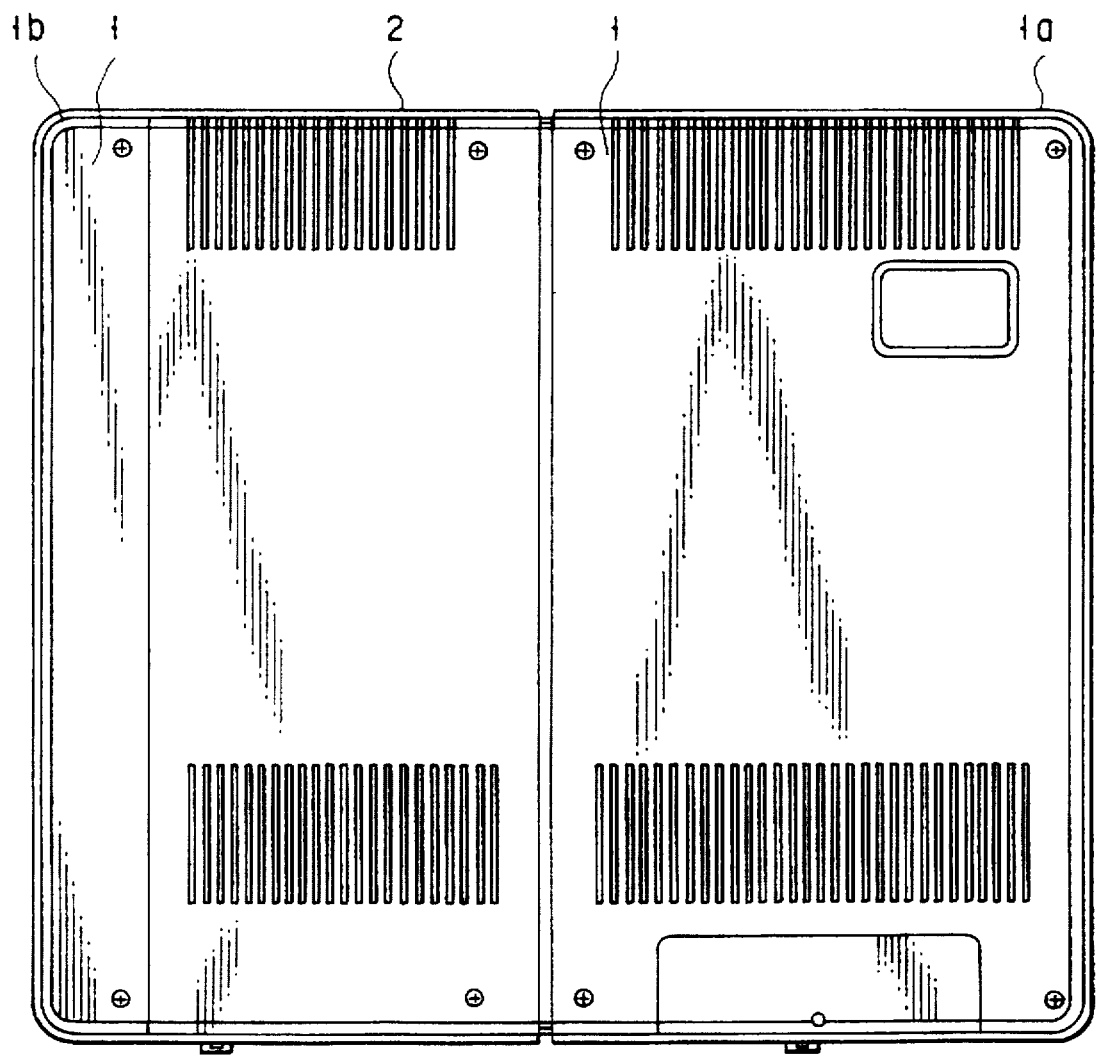
Figure 4A:
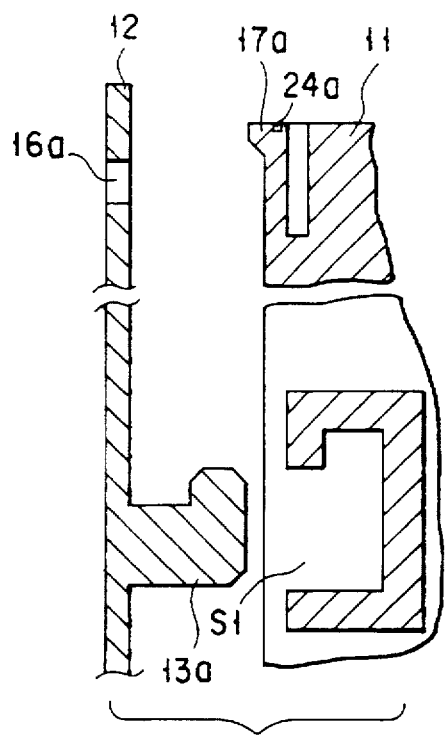
Figures 4B, 4C:
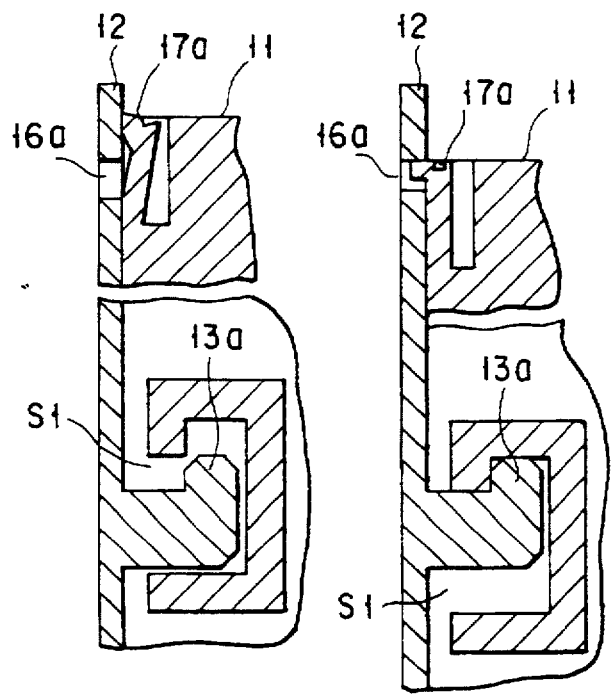
Figure 5:
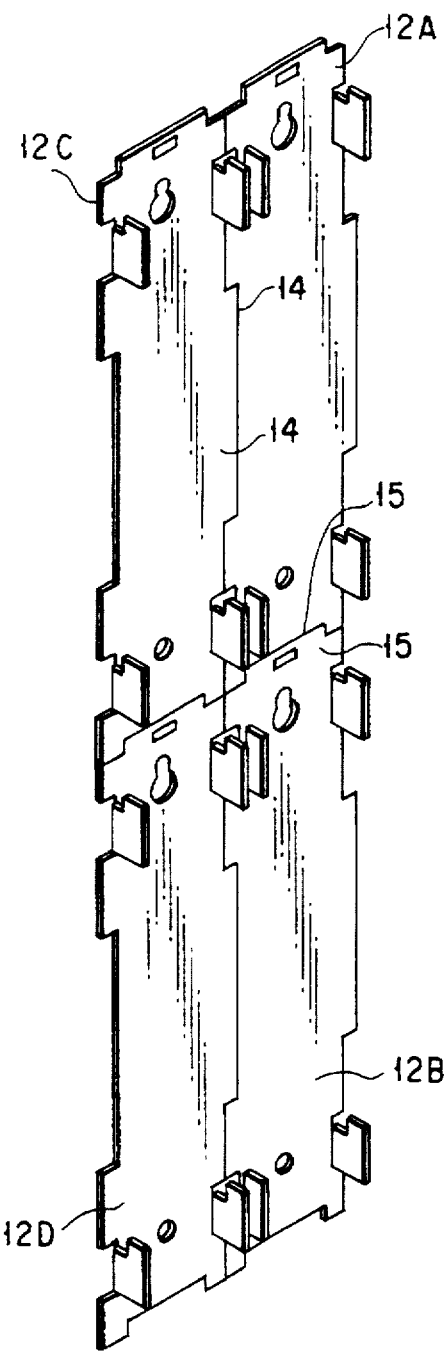
Figure 6:
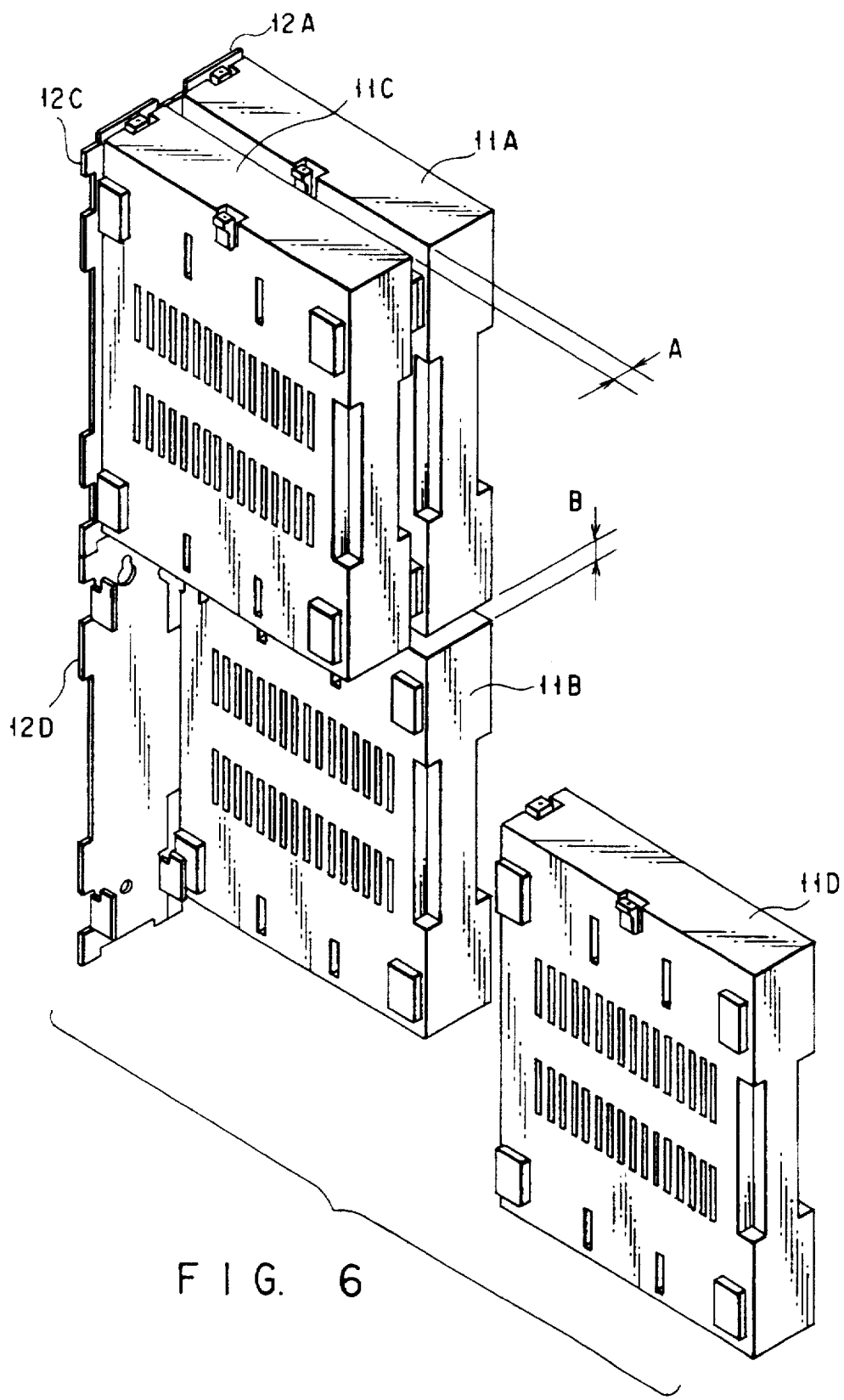
Figure 7:
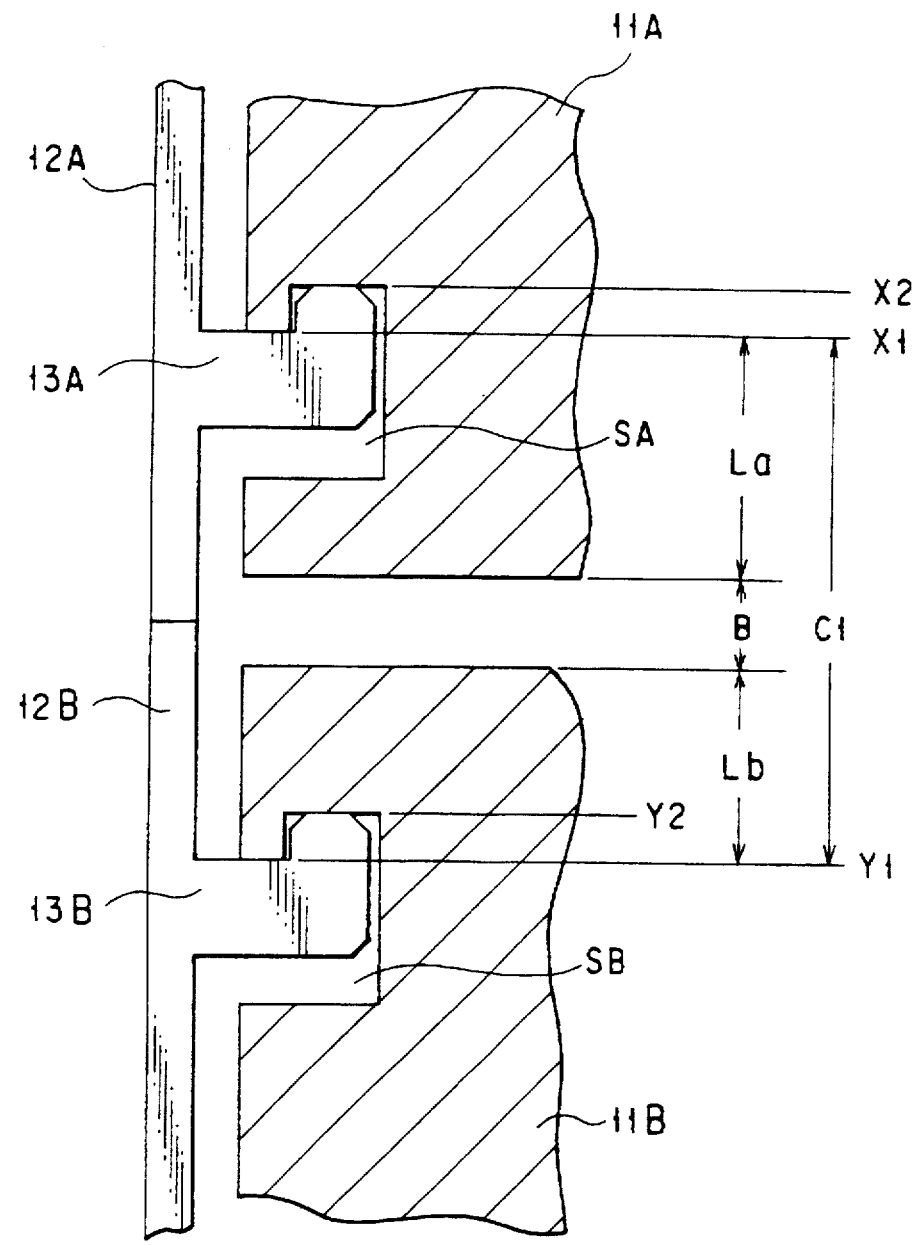
Figure 8:
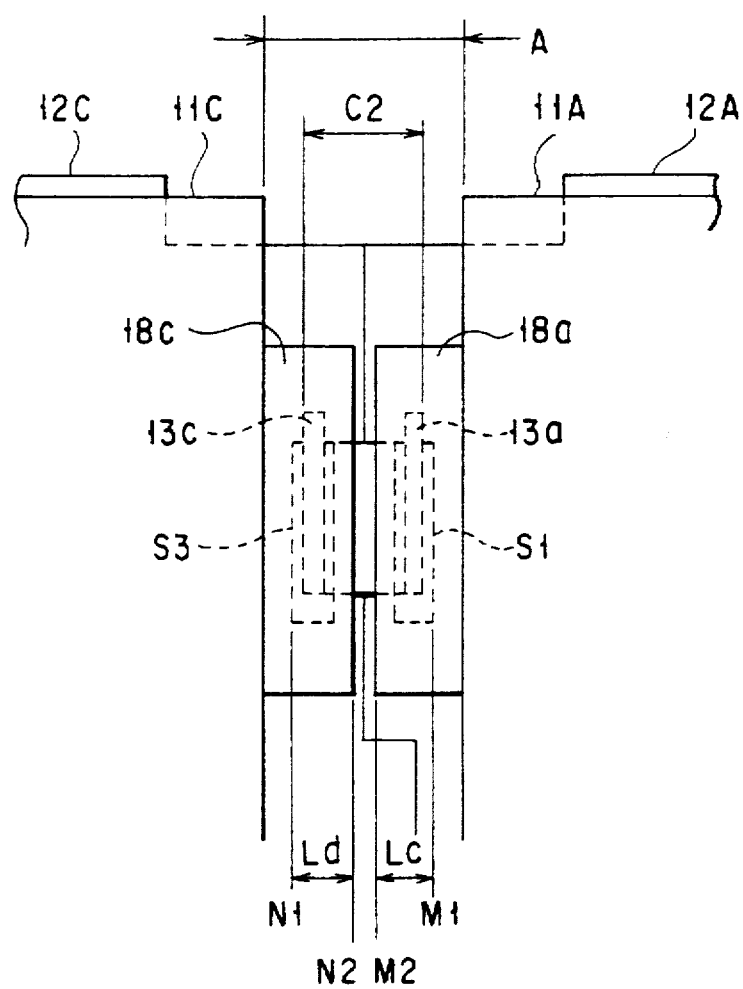
Figure 9:
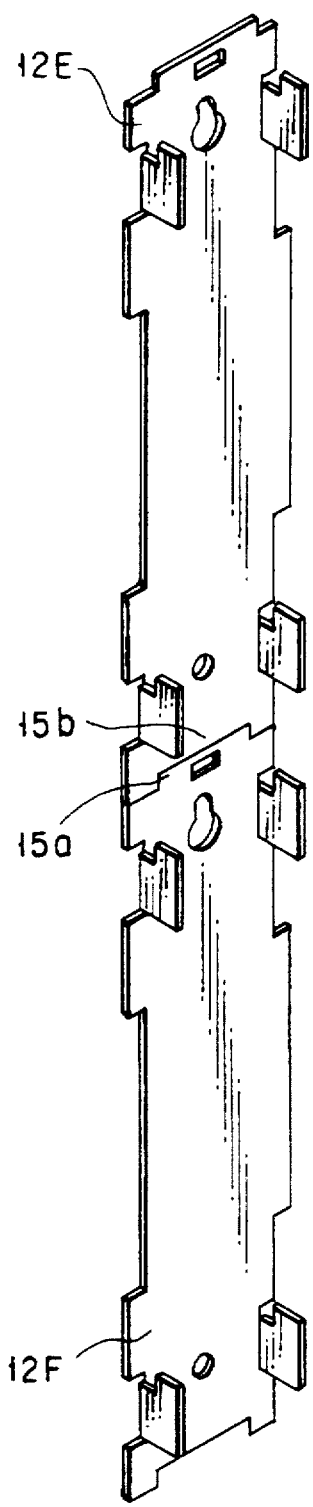
Figure 10:
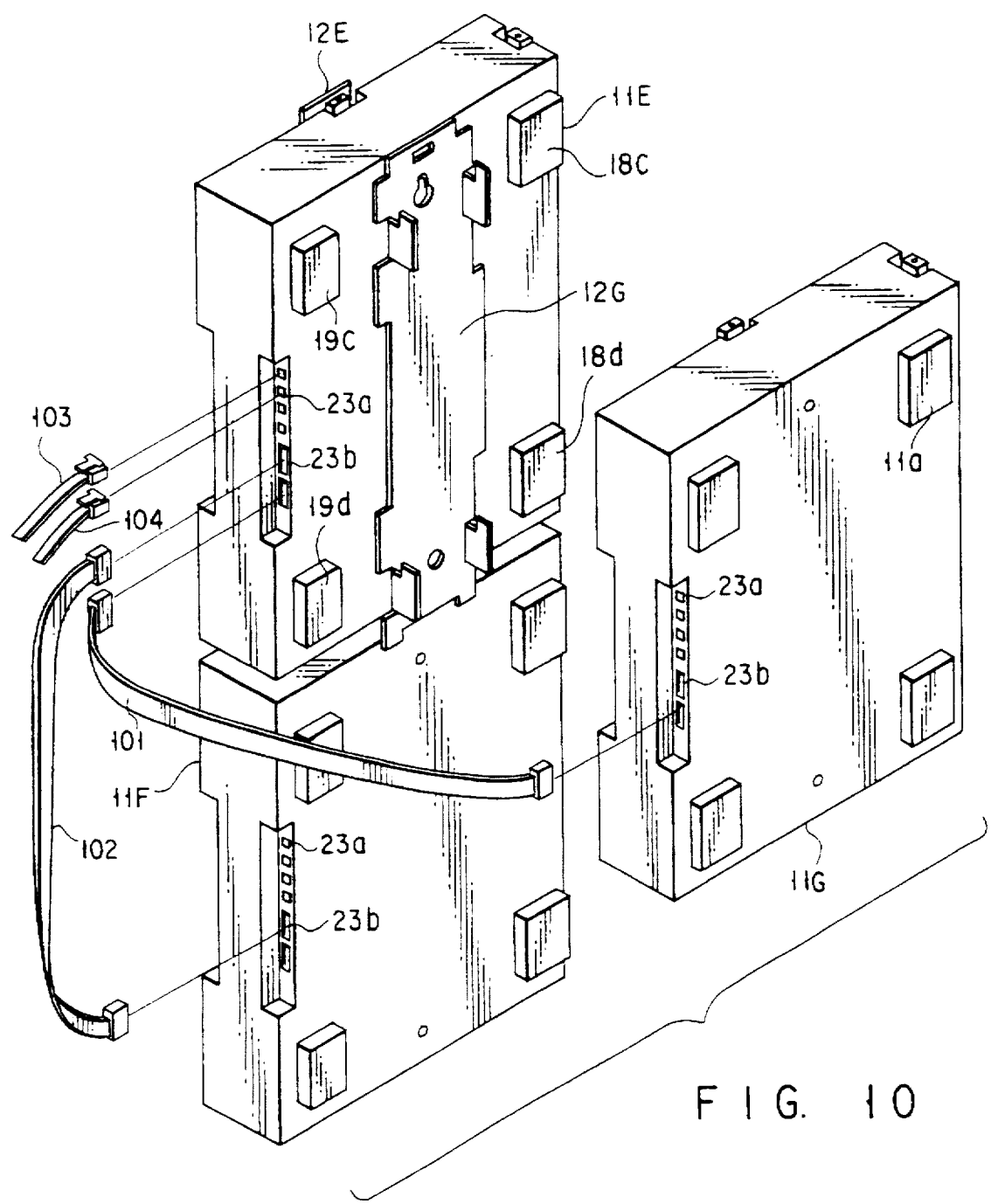

FIG. 1 is a front view of a housing structure for a key telephone unit as an example of a housing structure for conventional electronic equipment;

FIG. 2 is a perspective view of an embodiment of a housing structure for electronic equipment according to the present invention and its mounting jig;

FIG. 3 is a perspective view of the front structure of the housing shown in FIG. 2 in the embodiment;

FIGS. 4A to 4C are sectional views to help explain step by step how the housing is installed on the mounting jig in the embodiment;

FIG. 5 is a perspective view of an arrangement of mounting jigs in the embodiment;

FIG. 6 is a perspective view to help explain how a clearance is made between the housings when electronic equipment housings are installed on the mounting jigs Shown in FIG. 5;

FIG. 7 is a sectional view of the engagement of the housing with the mounting jig with the dimensions necessary for a clearance to be made between the upper and lower housings in the arrangement of FIG. 5;

FIG. 8 is a sectional view of the engagement of the housing with the mounting jig with the dimensions necessary for a clearance to be made between the right and left housing the arrangement of FIG. 5;

FIG. 9 is a perspective view of another arrangement of mounting jigs in the embodiment; and FIG. 10 is a perspective view to help explain how electronic equipment housings are combined by stacking them with the help of mounting jigs in the embodiment.

DETAILED DESCRIPTION OF THE PREFERRED EMBODIMENTS

Hereinafter, referring to FIGS. 2 to 10, an embodiment of the present invention will be explained in detail.

FIGS. 2 and 3 show the construction of the embodiment. Numeral 11 indicates a rectangular parallelepipedic housing that houses electronic circuit units (not shown) and is made of, for example, synthetic resin. Numeral 12 indicates a flat-plate mounting jig that is used to mount the housing 11 on the surface of a wall and is made of, for example, metal material.

The height (in the vertical direction in the figure) of the mounting jig 12 is a little greater than that of the housing 11 and its width is a little larger than that of the side of the housing 11. At the upper right and left edges and at the lower right and left edges of the mounting jig 12, tongues 13a to 13d are provided. These tongues 13a to 13d are bent at right angles to the flat plate surface and have the same L shape whose tip portion points upward.

In the central portion of the left edge of the mounting jig 12, a recessed section 14a is formed by cutting away a uniform width for a certain length, whereas at the right edge opposite to the recessed section, a projecting section 14b of a shape that fits into the recessed section is formed for a certain length.

At the top edge of the mounting jig 12, a projecting section 15a is formed, whereas in the bottom edge, a recessed section 15b is cut away into a shape that fits onto the projecting section 15a. On the center line of the mounting jig 12, a rectangular hole 16a, a potbellied hole 16b, and a round hole 16c are made in that order from the top.

4

In the rear side face of the housing 11, slits S1 to S4 into which the four tongues 13a to 13d are inserted are made in the upper right and left and the lower right and left in the central portion as shown in FIG. 2. At the top end of the portion where the slits S1 to S4 are made, a projection 17a with an elastic mechanism 17a that engages with the rectangular hole 16a in the mounting jig 12 is formed.

In positions near one side on the front and rear sides of the housing 11, as shown in FIGS. 2 and 3, first support bases 18a to 18d having a specific height are provided so as to face the tongues 13a to 13d of the mounting jig 12. The first support bases 18a to 18d each have a flat face parallel to the side of the housing 11. In the individual flat faces, slits (not shown) into which the tongues 13a to 13d are inserted are made in the positions corresponding to the tongues 13a to 13d of the mounting jig 12. At the top of one side of the housing 11, a projection 17b of the same shape as that of the projection 17a is formed.

On the front and rear side faces of the housing 11, second support bases 19a to 19d having the same height as that of the first support bases 18a to 18d are provided symmetrically with the first support bases 18a to 18d.

Furthermore, in the front and rear side faces of the housing 11, a lot of heat-dissipating holes 20 are made. Screw holes 21a and 21b are made in the upper and lower central portions on the front side face so as to correspond to the holes 16b, 16c in the mounting jig 12.

In the central portion of the corners where the other side of the housing 11 meets the front and rear side faces, cutout sections 22a and 22b having a specific length are made so as to narrow the width to make it easy to pick the housing. Furthermore, in the cutout section 22b (or 22a) in the front side face (or the rear side face), a plurality of connector terminals 23a and 23b of various types (e.g., modular jacks if and flat cable terminals, the electronic equipment is a telephone exchange) are provided.

Referring to FIG. 2, a case where the housing 11 is mounted via its side face on the surface of a wall with the help of the mounting jig 12 will be explained.

In this case, first, the mounting jig 12 is screwed to the surface of a wall using the potbellied hole 16b and round hole 16c. Then, the housing 11 is installed on the mounting jig 12 in such a manner that the tongues 13a to 13d of the mounting jig 12 are inserted into the slits (not shown) made in the flat side faces of the support bases 18a, 18d. At this time, as explained later, the projection 17b formed at the top end of the housing 11 enters the rectangular hole 16a in the mounting hole 12, thereby securing the top end of the housing 11 to the mounting jig 12.

Referring to FIG. 3, a case where the housing 11 is mounted via its rear side face on the surface of a wall with the help of the mounting jig 12.

In this case, too, first, the mounting jig 12 is screwed to the surface of a wall making use of the potbellied hole 16b and round hole 16c. Then, the housing 11 is installed on the mounting jig 12 in such a manner that the tongues 13a to 13d of the mounting jig 12 are inserted into the slits S1 to S4 in the rear side face. At this time, the projection 17a formed at the top end of the housing 11 enters the rectangular hole 16a in the mounting jig 12, thereby securing the top end of the housing 11 to the mounting jig 12.

Referring to FIGS. 4A to 4C, how the tongues 13a to 13d of the mounting jig 12 engage with the slits S1 to S4 in the housing and how the projection 17a (similarly, 17b) at the top end of the housing 11 is coupled to the rectangular hole 16a in the mounting jig 12 will be described. FIGS. 4A to 4C are sectional views of the rectangular hole 16a and tongue 13a in the mounting jig 12 and the slit S1 and projection 17a in the housing 11.

First, as shown in FIG. 4A, the housing 11 is placed so that the slit S1 may face the tongue 13a of the mounting jig 12. Then, as shown in FIG. 4B, the housing 11 is moved toward the mounting jig 12 until the tongue 13a is inserted into the slit S1. In this state, the projection 17a does not enter the rectangular hole 16a, and is in contact with the surface of the mounting jig 12.

Thereafter, as shown in FIG. 4C, the housing 11 is slid downward. As a result, the end of the tongue 13a comes into contact with the end of the slit S1. Then, the tip of the tongue touches the inner top face of the slit S1, preventing the housing 11 from sliding any farther, with the result that the housing 11 is supported by the tongue 13a. At the same time, lowering the position of the housing 11 allows the projection 17a to enter the hole 16a, thereby causing the projection 17a to engage with the hole 16a. This secures the housing 11 to the mounting jig 12.

To remove the housing 11 from the mounting jig 12, the preceding steps have only to be reversed. A groove 24a may be made at the top to make it easy to remove the projection 17a (similarly, 17b) from the hole 16a.

A case where a plurality of housings 11 are mounted on the surface of a wall using the mounting jigs 12 will be described with reference to FIGS. 5 and 6. Explained here will be a case where the individual housings 11 are fixed via their sides. Mounting the housings 11 via their sides has the advantage that the wall area required for mounting can be reduced when the number of housings 11 to be mounted is large.

FIG. 5 shows a plurality of mounting jigs 12A to 12D attached to the surface of a wall. In this case, the individual mounting jigs 12A to 12D are arranged side by side so that the projecting sections 14b may fit into the adjacent recessed sections 14a, the projecting and recessed sections being formed at the right and left edges of the individual mounting jigs 12A to 12D. As for the vertical direction, the mounting jigs are arranged vertically so that the projecting sections 15a may fit into the adjacent recessed sections 15b, the projecting and recessed sections being formed at the top and bottom edges of the individual mounting jigs.

Then, as shown in FIG. 6, the housings 11A to 11D are mounted on the individual mounting jigs 12A to 12D according to the above-described steps. In this case, the positions of the tongues 13a to 13d formed on the mounting jigs 12A to 12D, the positions of the slits made in the housings 11A to 11D, and the dimensions of the housings 11A to 11D are determined so that clearances A and B may be allowed between the right and left housings and the upper and lower housings for heat dissipation.

Referring to FIG. 7, a structure for allowing the clearance B in the vertical direction between the housings 11A and 11B will be explained.

FIG. 7 shows part of the two mounting jigs 12A, 12B positioned vertically on the mounting wall surface and the two housings 11A, 11B secured to the mounting jigs 12A, 12B. Specifically, the lower portions of the upper mounting jig 12A and housing 11A and the upper portions of the lower mounting jig 12B and housing 11B are schematically shown.

In the upper mounting jig 12A and housing 11A, the inside face of the lower slit SA in the housing 11A is in contact with the tongue 13A (corresponding to 13b and 13d in FIG. 2) of the mounting jig 12A at two points X1 and X2, which act as supporting points. In the lower mounting jig 12B and housing 11B, the inside face of the upper slit SB in the housing 11B is in contact with the tongue 13B (corresponding to 13a and 13c in FIG. 2) of the mounting jig 12B at two points Y1 and Y2, which act as supporting points.

Here, in the upper housing 11A, the length from the supporting point X1 to the bottom end of the housing 11A is assumed to be La, and in the lower housing 11B, the length from the supporting point Y1 to the top end of the housing 11B is assumed to be Lb. Furthermore, the length between the supporting points X1 and Y1 is assumed to be C1. With these assumptions, by determining the dimensions of the housings 11A, 11B and mounting jigs 12A, 12B so that C1 may be larger than the sum of La and Lb, the clearance B can be given between the upper and lower housings 11A and 11B.

The clearance B may be obtained by determining the above dimensions on the basis of the supporting point X2 of the upper housing 11A and the supporting point Y2 of the lower housing 11B.

Referring to FIG. 8, a structure for allowing the clearance A in the horizontal direction between the housings 11A and 11C will be explained.

FIG. 8 shows part of the two mounting jigs 12A, 12C positioned side by side or horizontally on the mounting wall surface and the two housings 11A, 11C secured to the mounting jigs 12A, 12C. Specifically, the top left end portions of the right mounting jig 12A and housing 11A and the top right end portions of the left mounting jig 12C and housing 11C are schematically shown.

In the right mounting jig 12A and housing 11A, the right movement of the housing 11A is limited when the right side of the slit S1 comes in contact with the tongue 13a. In the left mounting jig 12B and housing 11B, the left movement of the housing 11B is limited when the left side of the slit S3 comes in contact with the tongue 13B.

Here, the length from the point M1 where the left movement of the right housing 11A is limited to the left end M2 of the support base 18a on the housing 11A is assumed to be Lc. The length from the point N1 where the right movement of the left housing 11C is limited to the left end N2 of the support base 18c on the housing 11C is assumed to be Ld. In addition, the distance from the right face of the tongue 13a limiting the left movement of the right housing 11A to the left face of the tongue 13c limiting the right movement of the left housing 11C is assumed to be C2. With these assumptions, the dimensions are determined so that C2 may be larger than the sum of Lc and Ld. These relations apply to the other coupling sections and contact sections of the housings and mounting jigs.

When the housings 11 are arranged side by side, it is possible to prevent the housings 11 from wobbling by determining their dimensions so that the support bases 18a and 18c, 18b and 18d, 19a and 19c, and 19b and 19d of the adjacent housings may come into contact with each other.

Referring to FIGS. 9 and 10, a case where a plurality of housings 11E to 11G are mounted via their rear side faces will be described.

FIG. 9 shows the mounting jigs 12E and 12F arranged vertically and mounted on the surface of a wall. In this case, the mounting jigs 12E, 12F are arranged so that the projecting section formed at the top end of the mounting jig 12F may fit into the recessed section formed at the bottom end of the mounting jig 12E. To these mounting jigs 12E, 12F, the housings 11E, 11F are mounted making use of their rear sides. This makes it possible to arrange the housings 11E, 11F vertically and mount them on the wall surface.

Furthermore, another mounting jig 12G is screwed to the front side face of the housing 11E. Then, another housing 11G is installed on the mounting jig 12G. This makes it possible to mount the housing 11G on the housing 11E in a stacking manner.

With this arrangement, the amount of projection of the housings can be reduced in the case of thinner housings. Therefore, it is possible to reduce the possibility that the housings will be damaged by a lateral impact.

When the housing 11G is piled on the housing 11E as described above, the support bases 18c, 18d, 19c, and 19d on the front side face of the housing 11E come into contact with the support bases 18a, 18b, 19a, and 19b on the rear side face of the housing 11G, so that a clearance can be secured between the housings 11E and 11G for heat dissipation. The above-described approach also assures a clearance between the housings 11E and 11F arranged vertically.

With any arrangement, the connectors 23b provided in any one of the cutout sections 22a and 22b in the housing 11, are connected together by flat cables 101 and 102, facilitating the wiring of the housings. The number of connectors 23a can be increased or decreased as the need arises. The connectors 23a can be used to connect office lines or extension lines, by connecting the telephone lines 103 and 104.

In the embodiment, the tongues are formed as the projecting joint sections on the mounting jig 12 and the slits serving as the recessed joint sections into which the projecting joint sections (tongues) of the mounting jig 12 fit are made in the housing 11 to be mounted on the mounting jig 12. Conversely, the recessed joint sections may be formed on the mounting jig 12 and the projecting joint sections be formed on the housing 11.

While in the embodiment, the tongues are used as the projecting joint sections and the slits are used as the recessed joint sections, this is illustrative and not restrictive. The joint sections and coupling sections may take other shapes, as long as one fits into the other in a detachable manner.

Although slits into which the tongues 13a to 13d of the mounting jig 12 are inserted are made in the support bases 18a to 18d on the housing 11, the support bases 18a to 18d are not always necessary when the housing 11 is of the size that allows slits corresponding to the tongues 13a to 13d to be made in its side.

When the housings 11 are arranged vertically, the relations as explained in FIG. 7 can be fulfilled by making the top ends of the individual housings 11 lower than the top ends of the mounting jigs 12 to which the housings 11 are mounted, and at the same time, making the lower ends of the housings 11 higher that the lower ends of the mounting jigs 12, with the result that a clearance is secured between the housings arranged vertically.

Similarly, when the housings 11 are arranged side by side, a clearance is allowed between the housings arranged side by side by determining the dimensions so that the right and left ends of the individual housings 11 may be inside the right and left sides of the mounting jigs 12 on which the housings 11 are mounted.

As described above, with the present invention, the housings can be mounted on the faces having different areas. Therefore, when the number of housings is small, the housings can be prevented from projecting very much by, for example, mounting the housings via their rear side faces having a larger area. When the number of housings is large, the wall area in which the housings are mounted can be reduced by mounting the housings via their side faces. In this way, the faces with which the housings are mounted can be selected, depending on the number of housings to be mounted. Because the faces with which housings are mounted can be selected freely, this provides the flexibility in mounting places and facilitates work the more. Additionally, because many housings can be combined easily, this makes it possible to divide the circuit units into smaller blocks, and construct an economical system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electronic equipment mounting device comprising:
  a rectangular parallelepipedic housing that contains electronic circuit units of electronic equipment and has at least a first side face and a second side face adjoining each other and differing in area; and
  a flat-plate mounting jig that is selectively coupled in a detachable manner to either the first side face or the second side face of said housing and mounts said housing in any place, wherein said mounting jig has a height larger than the height in the mounting direction of the first and second side faces of said housing and has its top end and bottom end formed into a projecting shape and a recessed shape that fit to each other.

2. An electronic equipment mounting device comprising:
  a rectangular parallelepipedic housing that contains electronic circuit units of electronic equipment and has at least a first side face and a second side face adjoining each other and differing in area; and
  a flat-plate mounting jig that is selectively coupled in a detachable manner to either the first side face or the second side face of said housing and mounts said housing in any place, wherein said mounting jig has a width larger than that of a side face having a smaller area of said housing and has its right end and left end formed into a projecting shape and a recessed shape that fit to each other.

3. An electronic equipment mounting device comprising:
  a rectangular parallelepipedic housing that contains electronic circuit units of electronic equipment and has at least a first side face and a second side face adjoining each other and differing in area; and
  a flat-plate mounting jig that is selectively coupled in a detachable manner to either the first side face or the second side face of said housing and mounts said housing in any place, wherein a plurality of projecting sections and recessed sections are formed on said mounting jig and the first and second side faces of said housing and engage one with another in a detachable manner.

4. An electronic equipment mounting device comprising:
  a rectangular parallelepipedic housing that contains electronic circuit units of electronic equipment and has at least a first side face and a second side face adjoining each other and differing in area;
  a flat-plate mounting jig that is selectively coupled in a detachable manner to either the first side face or the second side face of said housing and mounts said housing in any place; and
  wherein a plurality of projecting sections and recessed sections are formed on said mounting jig and the first and second side faces of said housing and engage one with another in a detachable manner, said plurality of projecting sections including L-shaped tongues whose tip portions are bent in the same direction and said plurality of recessed sections include slits each having a length that allows the corresponding tongues to slide in the bend direction after the tongues have been inserted therein.

5. An electronic equipment mounting device comprising:

a rectangular parallelepipedic housing that contains electronic circuit units of electronic equipment and has at least a first side face and a second side face adjoining each other and differing in area;

a flat-plate mounting jig that is selectively coupled in a detachable manner to either the first side face or the second side face of said housing and mounts said housing in any place;

wherein a plurality of projecting sections and recessed sections are formed on said mounting jig and the first and second side faces of said housing and engage one with another in a detachable manner, said plurality of projecting sections including L-shaped tongues whose tip portions are bent in the same direction and said plurality of recessed sections include slits each having a length that allows the corresponding tongues to slide in the bend direction after the tongues have been inserted therein; and further comprising a hole and an elastic projection that are provided in said mounting jig and on the mounting jig coupling face of said housing respectively and engage with each other when said plurality of tongues are slid after the tongues have been inserted into the corresponding slits.

6. An electronic equipment mounting device comprising:

a rectangular parallelepipedic housing that contains electronic circuit units of electronic equipment and has at least a first side face and a second side face adjoining each other and differing in area;

a flat-plate mounting jig that is selectively coupled in a detachable manner to either the first side face or the second side face of said housing and mounts said housing in any place; and a cutout formed at the corner where the face opposite to the one having a smaller area of said mounting jig coupling faces of said housings meets at least one side.

7. An electronic equipment mounting device comprising:

a rectangular parallelepipedic housing that contains electronic circuit units of electronic equipment and has at least a first side face and a second side face adjoining each other and differing area;

a flat-plate mounting jig that is selectively coupled in a detachable manner to either the first side face or the second side face of said housing and mounts said housing in any place; and a cutout formed at the corner where the face opposite to the one having a smaller area of said mounting jig coupling faces of said housings meets at least one side and an external connection connector provided in said cutout section.

8. An electronic equipment mounting device comprising:

a rectangular parallelepipedic housing that contains electronic circuit units of electronic equipment and has at least a first side face and a second side face adjoining each other and differing in area; and a flat-plate mounting jig that is selectively coupled in a detachable manner to either the first side face or the second side face of said housing and mounts said housing in any place, wherein said mounting jig has a screw hole in it and said housing has a hole in it for screwing said mounting jig to the face opposite to the one having a larger area of said mounting jig coupling faces.

9. An electronic equipment mounting device comprising:

a plurality of rectangular parallelepipedic housings, each of which contains divided electronic circuit units of electronic equipment and has at least a first side face and a second side face adjoining each other and differing in area; and flat-plate mounting jigs which are provided so as to correspond to said plurality of housings and each of which is selectively coupled in a detachable manner to either the first side face or the second side face of the corresponding housing and mounts the housing in any place, and further each of which has a height larger than the height in the mounting direction of the first and second side faces of said housing and has the top end and the bottom end formed into a projecting shape and a recessed shape that fit to each other, and which are arranged vertically so that the top end may fit to the bottom end, and secure a clearance between said housings when said housings have been coupled to the individual mounting jigs.

10. An electronic equipment device according to claim 9, wherein said plurality of mounting jigs each have a width larger than that of the face having a smaller area of said housing and have the right end and the left end formed into a projecting section and a recessed section that fit to each other, are arranged side by side so that the left end may fit to the right end, and secure a clearance between said housings when the faces having a smaller area of said housings are mounted on the individual mounting jigs.

11. An electronic equipment mounting device comprising:

a plurality of rectangular parallelepipedic housings, each of which contains divided electronic circuit units of electronic equipment and has at least a first side face and a second side face adjoining each other and differing in area; and flat-plate mounting jigs which are provided so as to correspond to said plurality of housings and each of which is selectively coupled in a detachable manner to either the first side face or the second side face of the corresponding housing and mounts the housing in any place, wherein said plurality of mounting jigs each have screw holes in them, and said plurality of housings each have holes in them for screwing said mounting jigs to the faces opposite to those having a larger area of said mounting jig coupling faces and enable additional housings to be piled on them by screwing the mounting jigs to the faces.

12. An electronic equipment mounting device according to claim 9 or 11, wherein cutouts are made at the corners where the faces opposite to those having a smaller area of said mounting jig coupling faces of said housings meet at least one side face, external connection connectors are provided in the cutouts, and said plurality of housings are wired by electrically connecting the connectors to each other.

13. An electronic equipment mounting device comprising:

a rectangular parallelepipedic housing that contains electronic circuit units of electronic equipment and has at least a first side face and a second side face adjoining each other and differing in area; and a flat-plate mounting jig that is selectively coupled in a detachable manner to either the first side face or the second side face of said housing and mounts said housing in any place, wherein vent holes are made in the first and second side faces of said housing.

14. An electronic equipment mounting devise according to claim 9, wherein vent holes are made in the first and second side faces of said housing.

15. An electronic equipment mounting devise according to claim 11, wherein vent holes are made in the first and second side faces of said housing.

16. An electronic equipment mounting device having a housing coupling structure comprising:

- a flat-plate mounting jig selectively coupled to a rectangular parallelepipedic housing for electronic equipment, the housing including a first side face and a second side face adjoining the first side face and differing in area;
- a mounting jig engaging one of the first and second side faces of the housing by a first securing means, the first securing means including a plurality of projecting sections on one of the mounting jig and the housing for insertion in a plurality of recessed sections on the other of the mounting jig and the housing, the projecting sections each having distal portions bent in a common direction defining L-shaped tongues, and the recessed sections each including slits of a length to allow the L-shaped tongues inserted therein to move relative to the housing in a direction of the bent portions; and
- the mounting jig further engaging one of the first and second side faces of the housing by a second securing means, the second securing means including a projection on one of the mounting jig and housing for insertion in a hole of the other of the mounting jig and housing, the projection flexing to mate with the hole after said first coupling means is engaged, and said projection being releasable from the hole when a force is applied to the housing in a direction opposite said direction of relative movement of the L-shaped tongues.

17. An electronic equipment mounting device having an inter-housing connecting structure comprising:

- a plurality of flat-plate mounting jigs selectively coupled to a plurality of rectangular parallelepipedic housings for electronic equipment, each housing including a first side face, a second side face adjoining the first side face and differing in area, a recess in at least one corner of the housing defined by a third side face opposing the smaller of the first and second side faces, and a forth side face adjoining the third side face; and
- the electronic equipment of each housing connecting to each other and to external devices by a plurality of cables connected to a plurality of connectors provided in the housing recesses.

* * * * *

UNITED STATES PATENT AND TRADEMARK OFFICE
CERTIFICATE OF CORRECTION

PATENT NO. : 5,796,585
DATED : August 18, 1998
INVENTOR(S) : Akira SUGIYAMA et al.

It is certified that error appears in the above-indentified patent and that said Letters Patent is hereby corrected as shown below:

Claim 7, Col. 9, line 50, after "differing", insert --in--.

Claim 14, Col. 11, line 8, "devise" should read --device--.

Claim 15, Col. 11, line 11, "devise" should read --device--.

Signed and Sealed this

Twenty-ninth Day of June, 1999

Attest:

Q. TODD DICKINSON

*Attesting Officer*      Acting Commissioner of Patents and Trademarks